United States Patent
Pan

(10) Patent No.: US 12,380,937 B2
(45) Date of Patent: Aug. 5, 2025

(54) FERROELECTRIC MEMORY LOCAL SENSE AMPLIFICATION

(71) Applicant: Wuxi Smart Memories Technologies Co., Ltd., Wuxi (CN)

(72) Inventor: Feng Pan, Freemont, CA (US)

(73) Assignee: WUXI SMART MEMORIES TECHNOLOGIES CO., LTD., Wuxi (CN)

( * ) Notice: Subject to any disclaimer, the term of this patent is extended or adjusted under 35 U.S.C. 154(b) by 142 days.

(21) Appl. No.: 18/219,418

(22) Filed: Jul. 7, 2023

(65) Prior Publication Data
US 2025/0014622 A1    Jan. 9, 2025

(51) Int. Cl.
*G11C 11/22* (2006.01)
*G11C 7/08* (2006.01)

(52) U.S. Cl.
CPC ............ *G11C 11/2255* (2013.01); *G11C 7/08* (2013.01); *G11C 11/2273* (2013.01)

(58) Field of Classification Search
CPC .... G11C 11/2255; G11C 7/08; G11C 11/2273
See application file for complete search history.

(56) References Cited

U.S. PATENT DOCUMENTS

2005/0152172 A1*  7/2005  Jeong ............... G11C 11/22
                                                 365/145

* cited by examiner

*Primary Examiner* — Han Yang
(74) *Attorney, Agent, or Firm* — Bayes PLLC

(57) ABSTRACT

A FRAM memory device can include a plurality of FRAM memory cells, each FRAM memory cell including one transistor and one capacitor electrically coupled to the at least one transistor. The capacitor can be configured to store a bit of data. The memory device can also include a local bit-line configured to carry data to be read from or written to the plurality of memory cells. The memory device can further include a global bit-line configured to communicate with the local bit-line to carry the data to be read from or written to the plurality of memory cells. The memory device can additionally include a local sense amplifier configured to amplify a signal in the local bit-line and transfer the amplified signal to the global bit-line based on a reference signal. The local sense amplifier can be configured to generate the amplified signal based on comparison to the reference signal.

20 Claims, 13 Drawing Sheets

FERROELECTRIC MEMORY LOCAL SENSE AMPLIFICATION

CROSS-REFERENCE TO RELATED APPLICATIONS

This application is related to U.S. application Ser. No. 18/219,401, filed on Jul. 7, 2023, entitled "FERROELECTRIC MEMORY REFERENCE GENERATION,"U.S. application Ser. No. 18/219,426, filed on Jul. 7, 2023, entitled "FERROELECTRIC MEMORY WRITING METHOD AND ASSOCIATED DEVICES," and U.S. application Ser. No. 18/219,439, filed on Jul. 7, 2023, entitled "FERROELECTRIC MEMORY REFERENCE GENERATION," all of which are hereby incorporated by reference in their entireties.

BACKGROUND

Embodiments of the present disclosure relate to ferroelectric memory devices having local sense amplification.

The demand for a non-volatile memory that has high-endurance, low operational voltage, low power consumption, and high-speed operation suitable for various electronic devices, such as portable terminals and integrated circuit (IC) cards, has increased. Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast read and write performance, and great maximum read/write endurance.

SUMMARY

Ferroelectric memory devices having local sense amplification are disclosed herein.

In one aspect, a memory device can include a plurality of memory cells, each memory cell including at least one transistor and one capacitor electrically coupled to the at least one transistor. The capacitor can be configured to store a bit of data. The memory device can also include a local bit-line configured to carry data to be read from or written to the plurality of memory cells. The memory device can further include a global bit-line configured to communicate with the local bit-line to carry the data to be read from or written to the plurality of memory cells. The memory device can additionally include a local sense amplifier configured to amplify a signal in the local bit-line and transfer the amplified signal to the global bit-line based on a reference signal. The local sense amplifier can be configured to generate the amplified signal based on comparison to the reference signal.

In another aspect, a method of operating a memory device can include storing respective bits of data in a plurality of memory cells, each memory cell including at least one transistor and one capacitor electrically coupled to the at least one transistor. The method can also include carrying data on a local bit-line to be read from or to be written to the plurality of memory cells. The method can further include communicating using a global bit-line with the local bit-line to carry the data to be read from or written to the plurality of memory cells. The method can additionally include amplifying, using a local sense amplifier, a signal in the local bit-line and transferring the amplified signal to the global bit-line based on a reference signal, wherein the local sense amplifier generates the amplified signal based on comparison to the reference signal.

In yet another aspect, a memory device can include a plurality of groups of arrays of memory cells connected by a global bit-line. Each group of arrays can include a plurality of arrays. Each array of the group of arrays having a local bit-line. The memory device can also include a local sense amplifier connected between a pair of arrays of the group of arrays and connected to each local bit-line of the group of arrays. The memory device can further include a plurality of memory cells in each array, each memory cell comprising at least one transistor and one capacitor electrically coupled to the at least one transistor. The capacitor can be configured to store a bit of data. The local sense amplifier can be configured to amplify a signal between the local bit-line of the respective array and the global bit-line based on a reference signal. The local sense amplifier can be configured to generate the amplified signal based on comparison to the reference signal.

In another aspect, a method of operating a memory device can include storing respective bits of data in a plurality of memory cells. Each memory cell can include one transistor and one capacitor electrically coupled to the at least one transistor. The method can also include carrying data on a local bit-line to be read from or to be written to the plurality of memory cells. The method can further include communicating using a global bit-line with the local bit-line to carry the data to be read from or written to the plurality of memory cells. The method can additionally include amplifying, using a local sense amplifier, a signal in the local bit-line and transferring the amplified signal to the global bit-line based on a reference signal. The method can also include providing the reference signal using an amplifier or a buffer.

In still another aspect, a memory device can include a plurality of groups of arrays of memory cells connected by a global bit-line. Each group of arrays can include a plurality of arrays. Each array of the group of arrays can have a local bit-line. The memory device can also include a local sense amplifier connected between a pair of arrays of the group of arrays and connected to each local bit-line of the group of arrays. The memory device can further include a plurality of memory cells in each array. Each memory cell can include one transistor and one capacitor electrically coupled to the at least one transistor. The capacitor can be configured to store a bit of data. The local sense amplifier can be configured to amplify a signal between the local bit-line of the respective array and the global bit-line based on a reference signal. The memory device can also include an amplifier or a buffer configured to provide the reference signal to drive a plurality of local sense amplifiers including the local sense amplifier.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
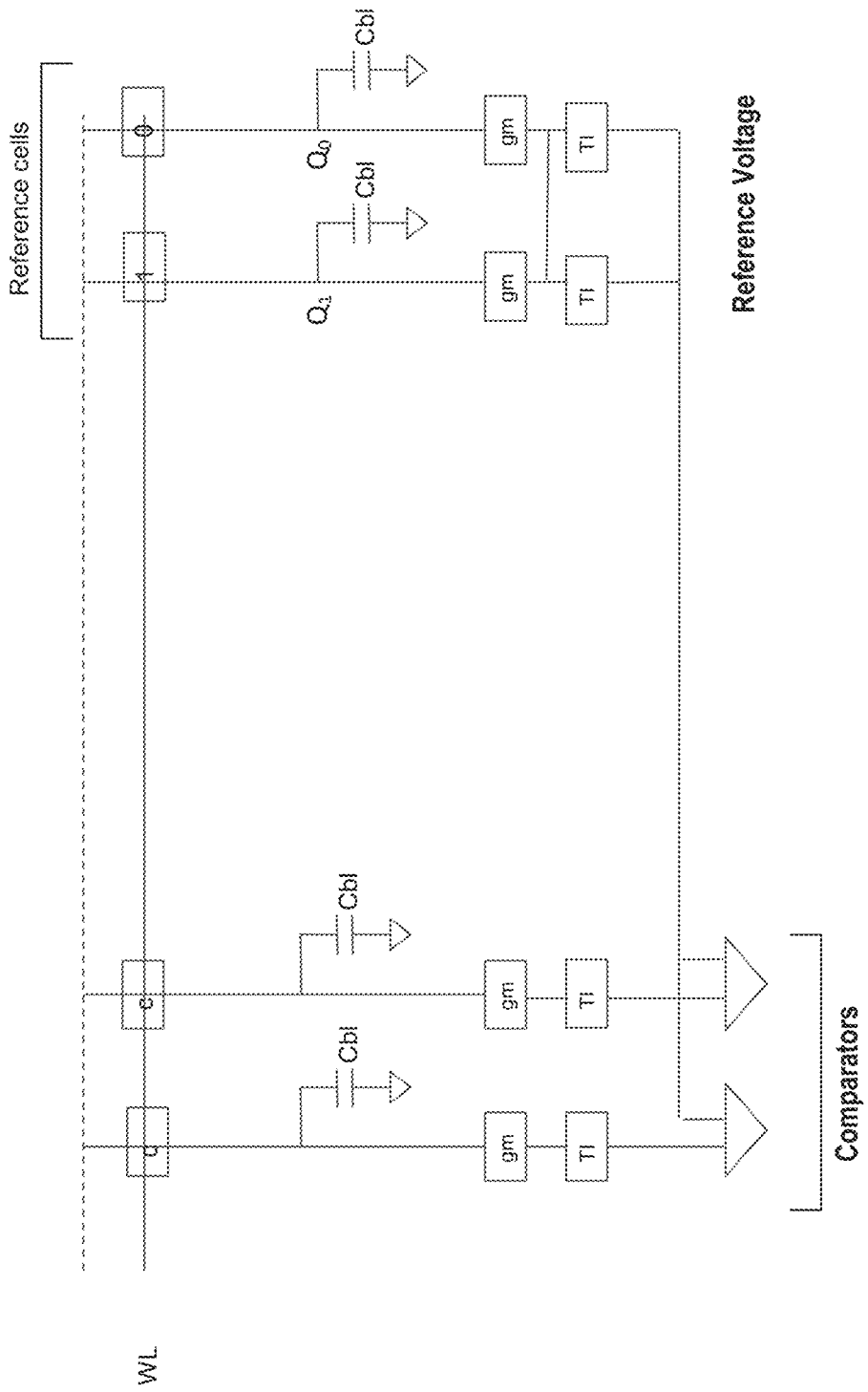
FIG. 1 illustrates a way to generate a reference voltage in a ferroelectric memory cell.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described. In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A memory cell array of the ferroelectric memory device may include a number of bit-lines and a number of word lines extending to cross with each other, and a number of memory cells may be arranged in a matrix at positions corresponding to the respective crossings of the lines. Each memory cell may include at least one memory cell select transistor, in which the gate electrode of the memory cell select transistor may receive a signal from the word line, and at least one ferroelectric capacitor with its top plate connected to the source of the memory cell select transistor and with its bottom plate connected to a cell plate line. This simplest construction may be referred to as "1T1C." The ferroelectric capacitor has a residual polarization characteristic to generate positive or negative residual polarizations depending on the high/low relationship between the voltage applied across the ferroelectric capacitor, from the bit-line via the memory cell select transistor and the voltage applied to the bottom plate of the ferroelectric capacitor from the cell plate line.

Some embodiments may be particularly beneficial to a 1T1C cell, as distinct from a two-transistor, two capacitors (2T2C) cell. In the latter, self-reference can be accomplished using two ferro-electrical capacitors: a true memory cell and a complementary memory cell to store opposite polarities of memory states in a pair, 2T2C can read (or sense) 0/1 or write 0/1 using a comparator without any additional reference voltages. Writing back can be performed while doing the read operation after signals on true/complement bit-lines are being amplified to the proper voltage levels with the comparator to complete the write operation.

With a 1T1C cell, a reference voltage may need to be generated to differentiate the cell information. In addition to the normal array, additional pairs of FRAM reference cells storing 0 and 1 may be physically added to memory array. In read, after 0/1 reference cells charge are being dumped onto two local reference bit-lines, the average value of two local reference bit-line voltages after charge sharing with FRAM 1/0 cells in READ represents the reference voltage level can be used for 1T1C sensing.

In 2T2C, one bit of information may require two transistors and two FRAM capacitors to store. By contrast, in 1T1C, a proper generated reference voltage may be used by multiple 1T1C cells in operations, which one bit of information may rely as few as one transistor and one FRAM capacitor to store. The number of additional pairs of reference cells may depend on process, cell device engineering and circuit performance. The array efficiency (area) of 1T1C scheme may be higher than that of the 2T2C scheme, with up to 50% improvement being possible.

For 1T1C in write operation, the global bit-lines are driven to logic 0 or 1 with actual data. The global bit-lines may be driven with rail-to-rail supply voltages. The global bit-line signals may not be able to drive the local bit-lines to rail-to-rail supply voltages due to architecture. The local bit-lines may need a reference voltage and a local comparator/amplifier in write operation, to amplify local bit-line voltage to full rail-to-rail supply voltages. A differential sensing may be used to convert a potentially weak signal on local bit-line to a rail-to-rail data signal. The local bit-line may address, for example, 256 individual 1T1C cells connected to a single local bit-lines.

Certain embodiments place an op-amp/buffer exactly at array boundary. This implementation may allow identical capacitance between data bit-line and reference bit-lines, and properly average the 0 and 1 reference bit-line voltages, as well as buffering this generated reference voltage to drive local sense amplifiers (of any kind) for 1T1C sensing. This may serve as a fundamental aspect of 1T1C FRAM architecture.

FIG. 1 illustrates a way to generate a reference voltage for 1T1C architecture in a ferroelectric memory cell array. In this approach, on each selected word line, two reference cells (same as regular memory cells) storing "0" and "1" information are used. $Q_1$ is the total charge released by a cell storing a logical one in read operation, and $Q_0$ is the total charge released by a cell storing a logical zero. In Read operation, when the charges are dumped out to the local bit-lines, a voltage would be developed on the corresponding local bit-line. In FIG. 1, gm represents a trans-conductance circuit, and TI represents a trans-impedance circuit. The trans-conductance circuit performs an input voltage to an output current conversion, and the trans-impedance circuit performs an input current to an output voltage conversion. The outputs of the transconductance circuits for the reference cells could be summed and be fed to the input of two subsequent trans-impedance circuits, yielding an output reference voltage that can then be shared by comparators for all bit-lines. The word line (WL) can have more than one cell (c) including the reference cells, identified as 1 and 0 for their stored logical values. There may be a cell bit-line capacitance (Cbl) associated with each bit-line. The trans-impedance circuit and trans-conductance circuit for each of the bit-lines could consume large die size for real design consideration (offset, mismatch, kick-back noise, speed, and the like) and may not be production-worthy in real applications.

Figure 2:
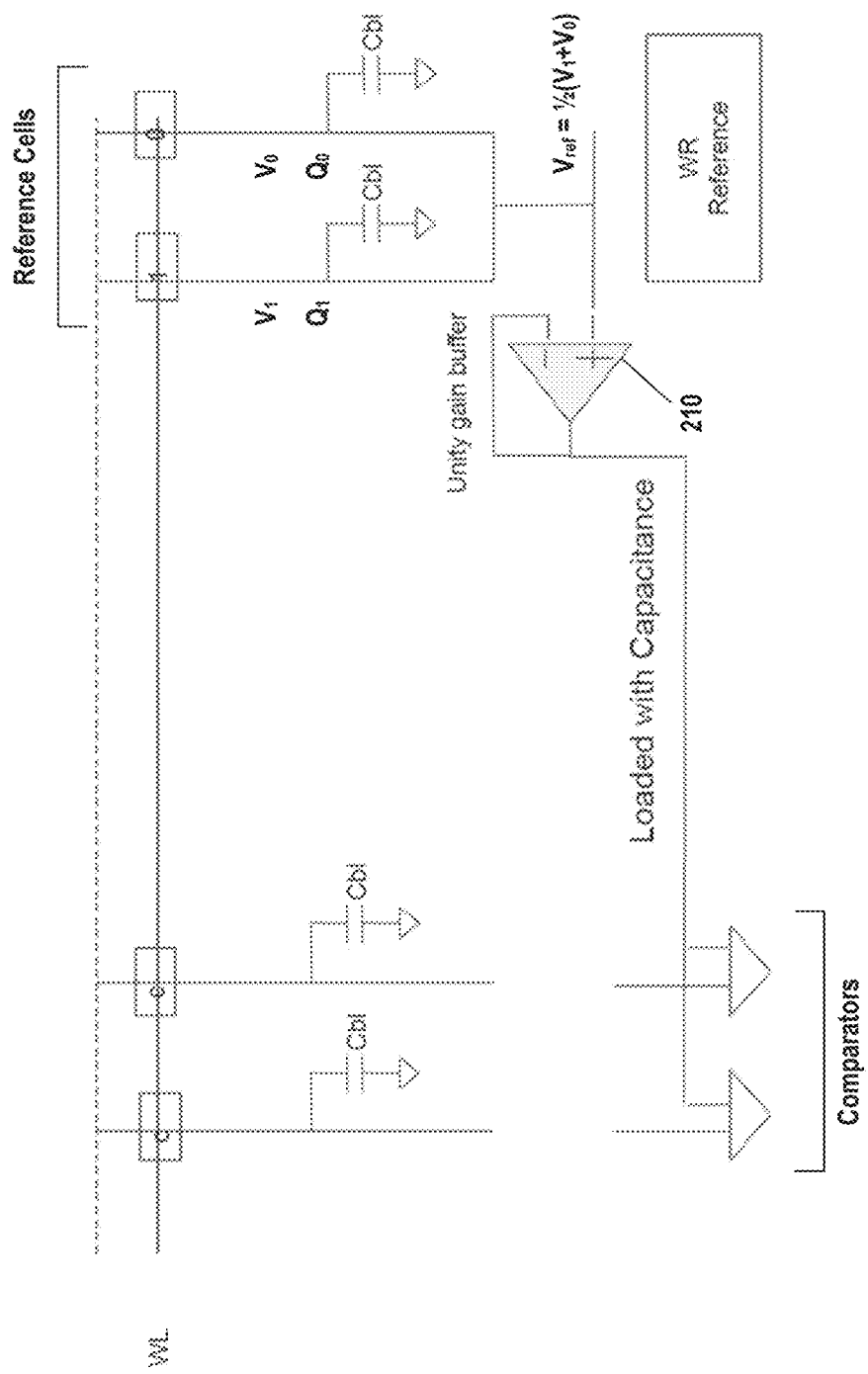
FIG. 2 illustrates a way to generate a reference voltage in a ferroelectric memory cell according to some embodiments of the present disclosure.

FIG. 2 illustrates a new way to generate a reference voltage for 1T1C architecture in a ferroelectric memory cell array according to some embodiments of the present disclosure. Similar to the circuit of FIG. 1, for each word-line, the circuit of FIG. 2 can include two reference cells, respectively storing a logical one and a logical zero. In the approach of FIG. 2, exactly at the boundary of local bit-lines, each local bit-line of real cell or reference cell can be terminated by comparator. This architecture may allow identical local bit-line capacitance in read operation for data cell and reference cells. In read operation, through charge summing of "0" and "1" cells over two local bit-lines capacitance, Vref can be generated as the average of V1 (the local bit-line voltage derived from the logic one charge dumped into the local bit-line capacitance) and V0 (the local bit-line voltage derived from the logic zero charge dumped into the local bit-one capacitance). Local bit-lines can be matched in cell array, as can be the bit-line capacitances.

While Vref generated in this way may be the appropriate voltage, it would not be able to drive the large capacitive load of following comparators directly. Accordingly, a unity gain amplifier/buffer 210 can be provided enough drivability to buffer the reference voltage Vref. Other ways of generating Vref are also permitted.

Unity gain buffer 210 may be implemented with an operational amplifier (op-amp). The connection of the op-amp as a unity gain amplifier is illustrated through the use of the feedback path. Unity gain buffer 210 may avoid taking any current from the input source. Instead, the unity gain buffer can isolate the input side (the reference cells) from the output side (the comparators). As shown in FIG. 2, the output of unity gain buffer 210 may be loaded with capacitance associated with, for example, reference bias. For each comparator, each local bit-line and each connection of reference bias may see the identical capacitance load for matching. The precise interconnection and configuration of circuit for the comparators are not shown, as it can vary. In contrast with the reference voltage approach in FIG. 1, a unity gain amplifier is much smaller in size, and can implement an active circuit with closed loop response and low output impedance for supreme drivability.

Figure 3:
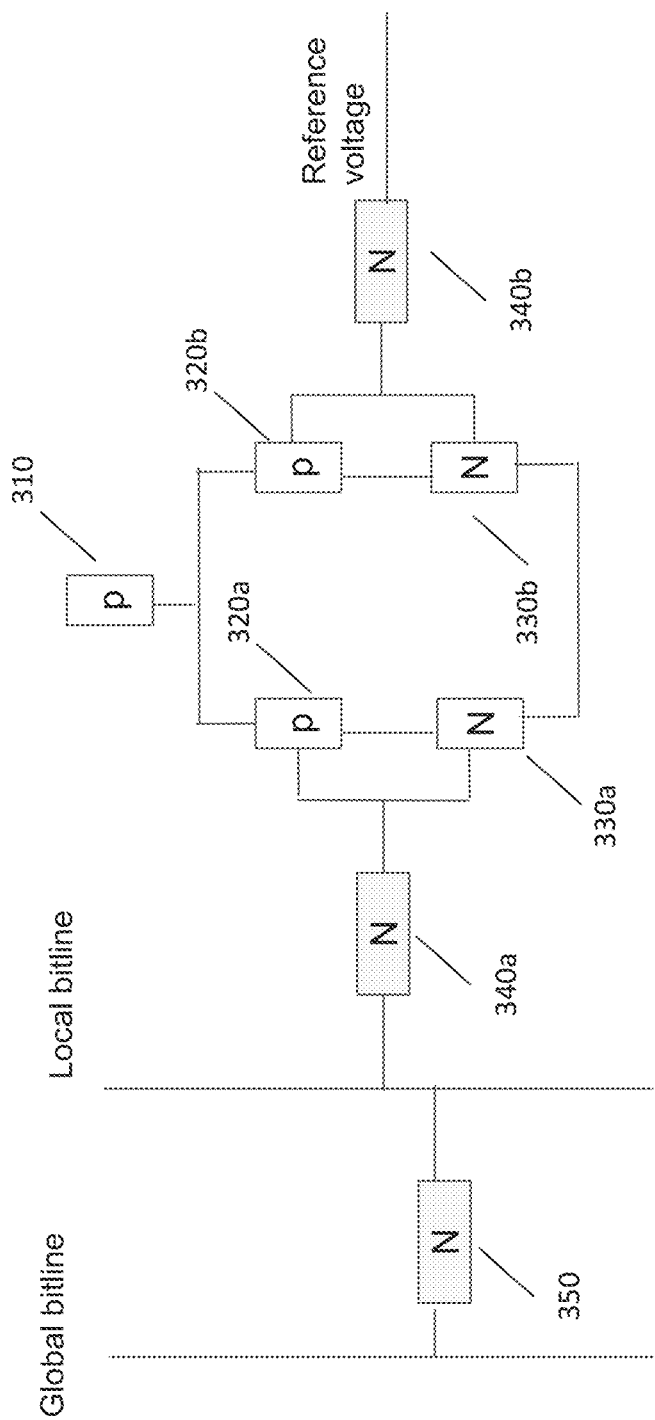
FIG. 3 illustrates local sensing amplification.

FIG. 3 illustrates local sensing amplification. As shown in FIG. 3, the local sense amplifier, in which some of the connections are omitted for the sake of simplicity of explanation, can include a sensing transistor 310, shown as a p-type transistor. There can also be a pair of p-type transistors 320*a*, 320*b*, and a pair of n-type transistors 330*a*, 330*b*, which can be connected to amplify a signal coming from the local bit-line (such as in the case of a read operation). A second pair of n-type transistors 340*a*. 340*b* can serve as pass gates. Thus, for example, during a read operation, charge can be sampled and held by pass gate n-type transistors 340*a*/340*b* (for the cell signal and the reference voltage, respectively), supplied with a supply voltage, such as vcc, by transistor 310, p-type transistors 320*a* and 320*b* together with n-type transistors 330*a* and 330*b* can amplify the signal in hold mode. Subsequently 340*a* would be opened to allow local bit-line to be driven to rail-to-rail supply voltage. Finally, transistor 350 can be opened to allow local bit-line to drive global bit-line and pass the sensed data to periphery circuit.

Other local sensing circuits/operations are also permitted. Thus, the particular arrangement shown in FIG. 3 should be considered as an example, and not by way of limitation.

Figure 4A:
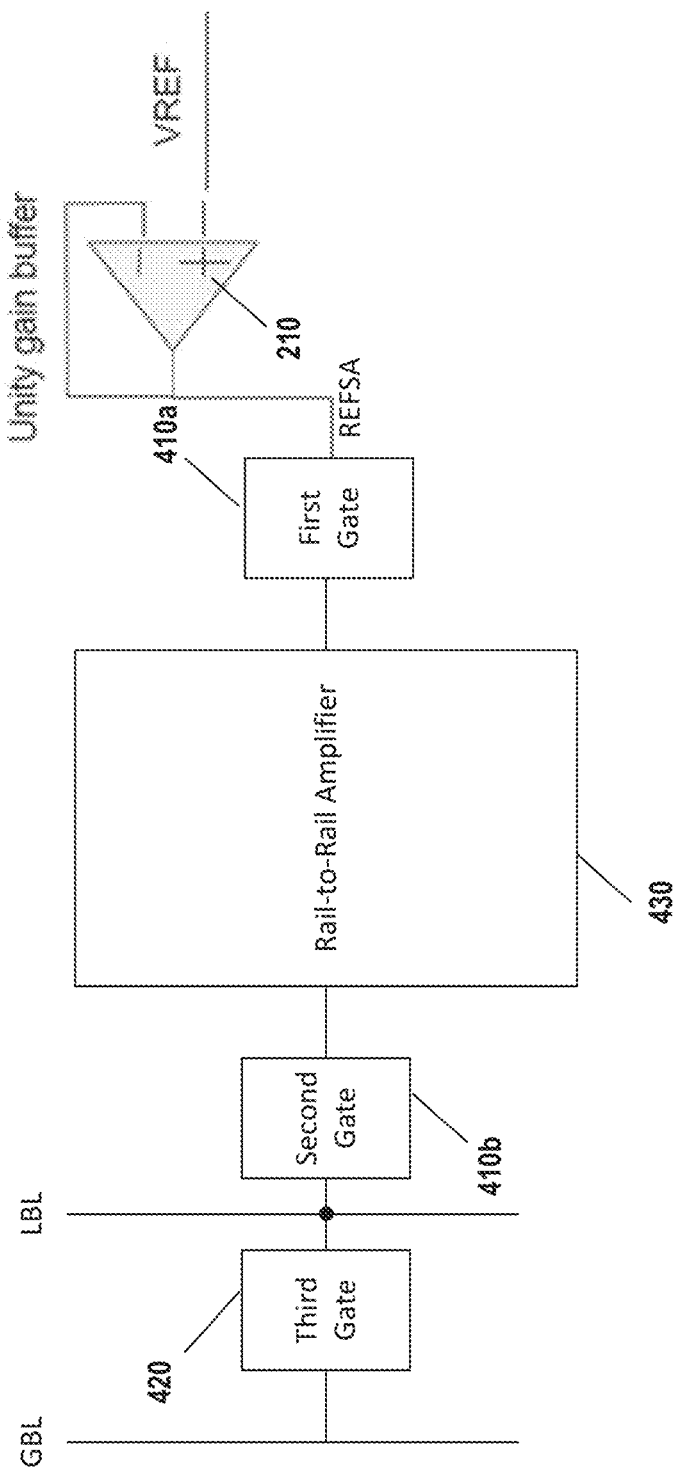
FIG. 4A illustrates the detail of a local sense amplifier according to some embodiments.

FIG. 4A illustrates a local sense amplifier implementation. As shown in FIG. 4A, for read operation there may be a need to sample local bit-line and REFSA signals onto the internal nodes of cross-coupled pair, close the pass transistors on both side, use local amplification to get logic 0/1 on internal nodes of cross-coupled pair, and then release the pass gate on local bit-line side to amplify the local bit-line only to rail-to-rail supply voltages. This would not be needed on the reference side. FRAM may use a destructive reading technique. Accordingly, it may be necessary to write back each bit at the end of read. The 1T1C write back operation here can be performed automatically at the end of read for FRAM cells. On the reference side, the write back can use a dedicated driver that simply always writes back one and zero to reference cells with whatever algorithms (for example, always the same value, always the opposite value of the previous write back, or any other desired algorithm), respectively.

More particularly, FIG. 4A illustrates some detail of a local sense amplifier according to some embodiments. As shown in FIG. 4A, a local sense amplifier can be provided with a reference voltage, REFSA via unity gain buffer 210, based on a reference voltage, VREF, which may be obtained as illustrated in FIG. 2 above, or by any other desired technique. The local sense amplifier can be referred to as a local sense amplifier because the amplifier may need, in some sense, to sense whether a data level is high or low with respect to reference voltage REFSA/VREF, and then drive the data signal level on LBL to the rail. In other words, if the voltage of a signal is above the buffered reference voltage REFSA, the local sense amplifier may drive the signal to the high power supply level, whereas if the signal is below the buffered reference voltage REFSA, the local sense amplifier may drive the signal to the low power supply level.

The reference voltage can be supplied to a local sense amplifier through a first gate 410*a* serving as a pass gate. Similarly, a second gate 410*b* can serve as a pass gate for the read operations of the memory device. During a write operation, a third gate 420 can permit a signal from the global bit-line (GBL) to pass to the local bit-line (LBL). During the read operation, by contrast, the signal from the local bit-line may first pass through the second gate 410*b*, be amplified by rail-to-rail amplifier 430, which may be connected to drive the signal high when the signal is above the reference voltage and to drive the signal low when the signal is below the reference voltage. Other amplification circuits are also permitted. Once the signal has been amplified, the third gate 420 can permit the signal to pass to the global bit-line to a secondary sensing operation remote from the local bit-line.

In write operation, the written data from the global bit-line passed to the local bit-line may need amplification. For example, in such a case, the signal from the global bit-line can pass through the third gate 420 and the second gate 410b. The signal can then be amplified by the rail-to-rail amplifier 430. Then, the signal can return through the second gate 410b in full logic supply levels and pass to the local bit-line. The first 410a, second gate 410b, and third gate 420 can each be implemented by one or more transistors.

In write operation, the reference may be generated according to any desired way. For example, the write reference voltage can be generated exactly like the read reference voltage. Other ways of generating the write reference can also be used, as the write signal may have a very large signal margin between 1 and 0, coming as a full rail signal from global bit line.

Figure 4B:
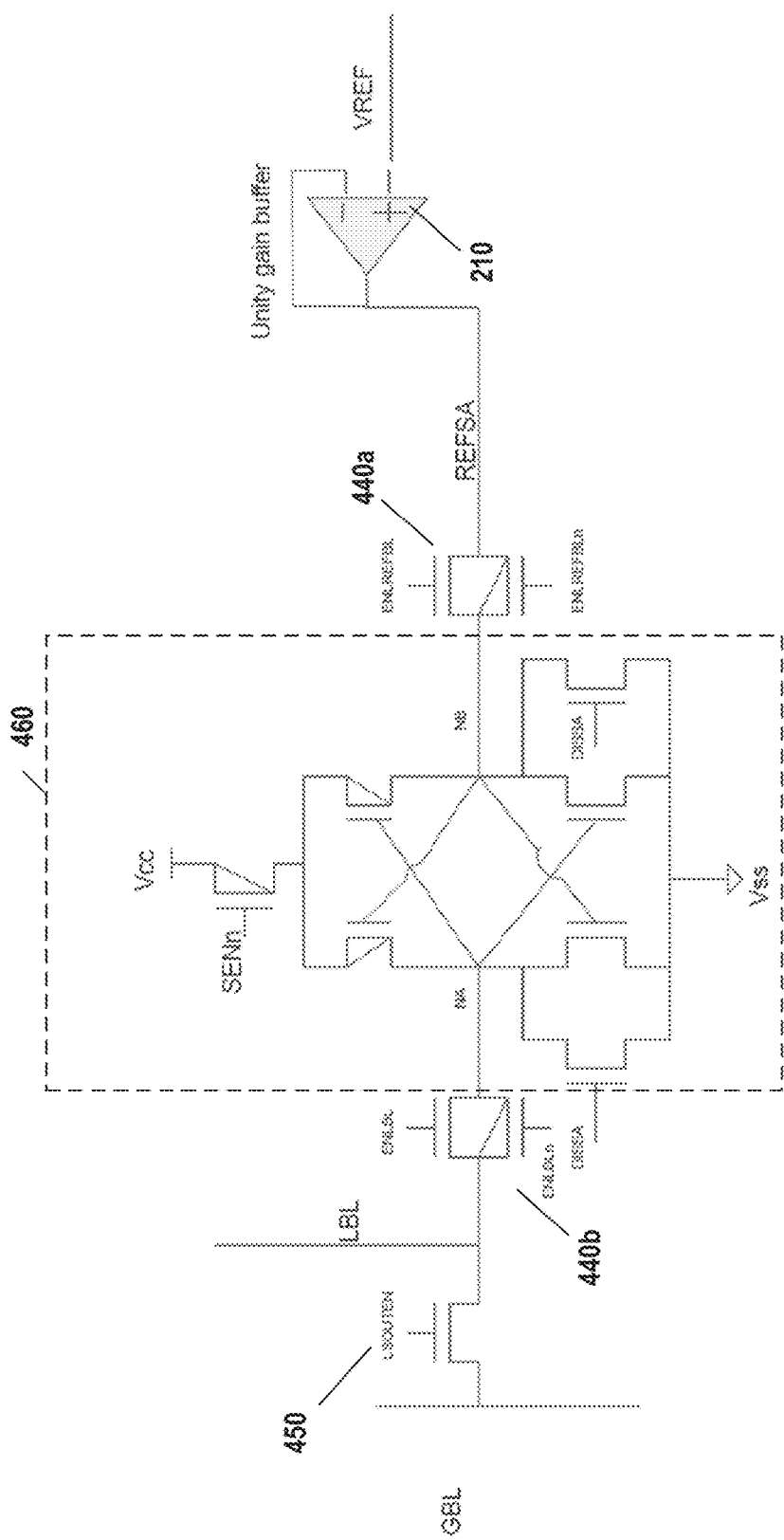
FIG. 4B illustrates additional detail of a local sense amplifier implementation according to some embodiments.

FIG. 4B illustrates additional detail of a local sense amplifier implementation according to some embodiments. As shown in FIG. 4B, for read operation there may be a need to sample local bit-line and REFSA signals onto the internal nodes of cross-coupled pair, close the pass transistors on both side, use local amplification to get logic 0/1 on internal nodes of cross-coupled pair, and then release the pass gate on local bit-line side to amplify the local bit-line only to rail-to-rail supply voltages. This would not be needed on the reference side. FRAM may use a destructive reading technique. Accordingly, it may be necessary to write back each bit at the end of read. The 1T1C write back operation here can be performed automatically at the end of read for FRAM cells. On the reference side, the write back can use a dedicated driver that simply always writes back one and zero to reference cells with whatever algorithms (for example, always the same value, always the opposite value of the previous write back, or any other desired algorithm), respectively.

More particularly. FIG. 4B illustrates the detail of a local sense amplifier according to some embodiments. As shown in FIG. 4B, a local sense amplifier can be provided with a reference voltage, REFSA via unity gain buffer 210, based on a reference voltage, VREF, which may be obtained as illustrated in FIG. 2 above, or by any other desired technique. The local sense amplifier can be referred to as a local sense amplifier, because the amplifier may need, in some sense, to sense whether a data level is high or low with respect to reference voltage REFSA/VREF, and then drive the data signal level on LBL to the rail. In other words, if the voltage of a signal is above the buffered reference voltage REFSA, the local sense amplifier may drive the signal to the high power supply level, whereas if the signal is below the buffered reference voltage REFSA, the local sense amplifier may drive the signal to the low power supply level.

The reference voltage can be supplied to a local sense amplifier through a first complementary pair of transistors 440a serving as a pass gate. A pass gate may not be needed if an n-channel transistor with boosted gate bias is used. Similarly, a second complementary pair of transistors 440b can serve as a pass gate for the read operations of the memory device. During a write operation, a first transistor 450 can permit a signal from the global bit-line (GBL) to pass to the local bit-line (LBL). During the read operation, by contrast, the signal from the local bit-line may first pass through the second complementary pair of transistors 440b, be amplified by amplifying components 460, which may be connected to drive the signal high when the signal is above the reference voltage and to drive the signal low when the signal is below the reference voltage. Other such amplification circuits are also permitted. Once the signal has been amplified, the first transistor 450 can permit the signal to pass to the global bit-line to a secondary sensing operation remote from the local bit-line.

In write operation, the written data from the global bit-line passed to the local bit-line may need amplification. For example, in such a case, the signal from the global bit-line can pass through the first transistor 450 and the second complementary pair of transistors 440b. The signal can then be amplified by the amplifying components 460. Then, the signal can return through the second pair of complementary transistors 440b in full logic supply levels and pass to the local bit-line.

In some embodiments, the first pair of complementary transistors 440a and the second pair of complementary transistors 440b can be replaced by simply an n-type transistor, thereby reducing die size. This may be done if the n-channel gate voltage can be boosted.

Figure 4C:
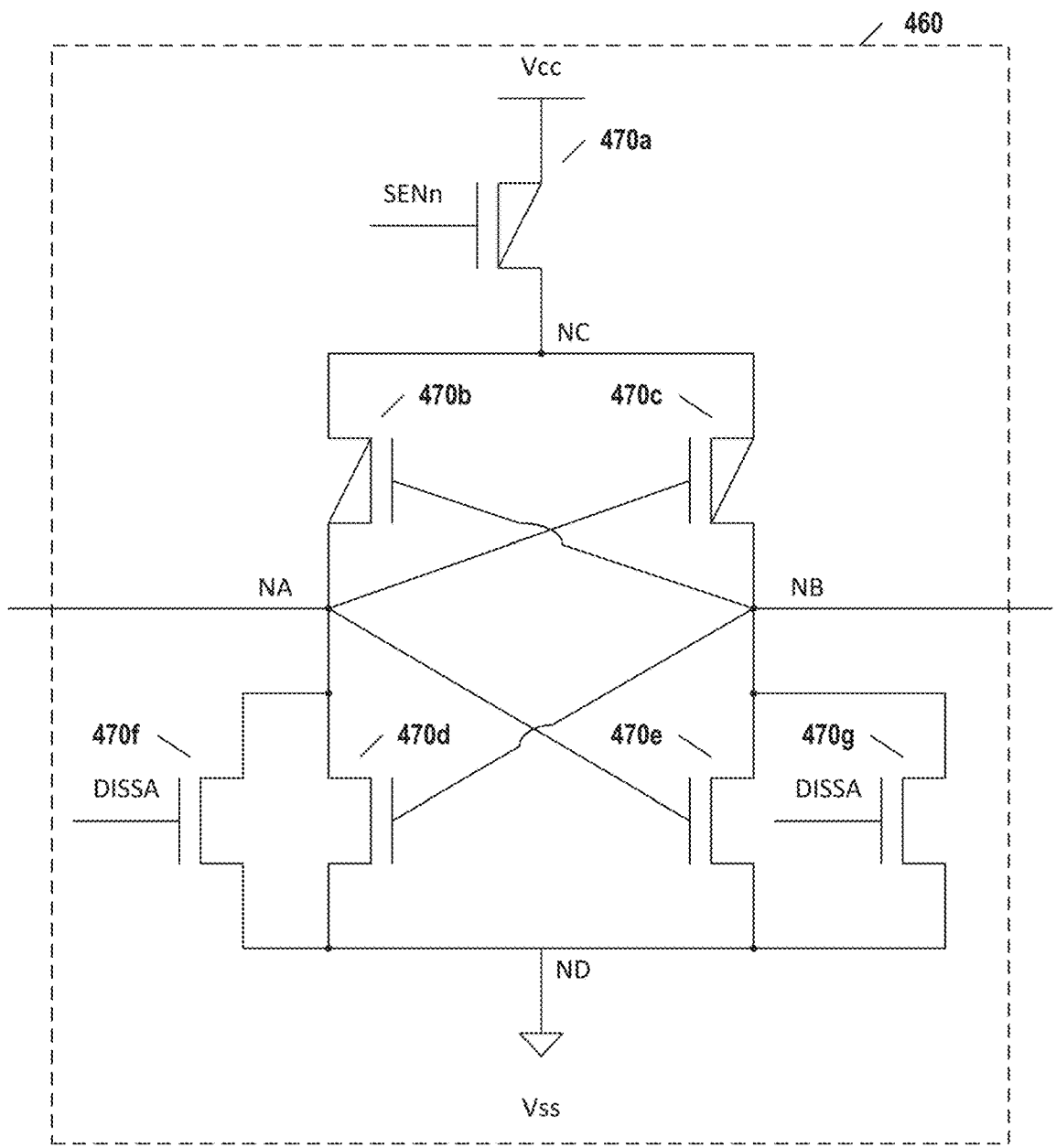
FIG. 4C illustrates additional detail regarding amplifying components of certain embodiments of the present disclosure.

FIG. 4C illustrates additional detail regarding amplifying components of certain embodiments of the present disclosure. As shown in FIG. 4C, amplifying components 460 can include a first p-type transistor 470a, controlled by signal SENn, which can be used to provide Vcc to node NC. A reference voltage can be supplied at node NB. Signal DISSA can provide a path for node NA and node NB to the voltage at node ND, namely Vss, which may be a low or ground voltage, respectively through n-type transistor 470f or n-type transistor 470g. Signal DISSA can be viewed as a sensing amplifier disabling signal to reset internal nodes to VSS, whereas SENn can be viewed as a sensing enabling signal.

When n-type transistor 470f and n-type transistor 470g are off, n-type transistors 470d and 470e can be respectively controlled by the voltages at nodes NA and NB. When the voltage at NA is initially higher than the voltage at NB, the voltage at NA can be driven toward Vcc, by operation of interconnected transistors 470b, 470c, 470d, and 470e. Likewise, when the voltage at NA is initially lower than the voltage at NB, the voltage at NA can be driven toward Vss by operation of interconnected transistors 470b, 470c. 470d, and 470e. This configuration can be considered a rail-to-rail amplifier, in that voltage at NA can be driven to one of the two rail voltages, either Vcc or Vss, depending on whether the voltage at NA is initially above or below the voltage at NB. Thus, the arrangement of transistors 470b, 470c, 470d, and 470e can provide a comparison result based on the relative values of nodes NA and NB, in combination with the other circuit elements shown or similar or equivalent circuit elements.

Figure 4D:
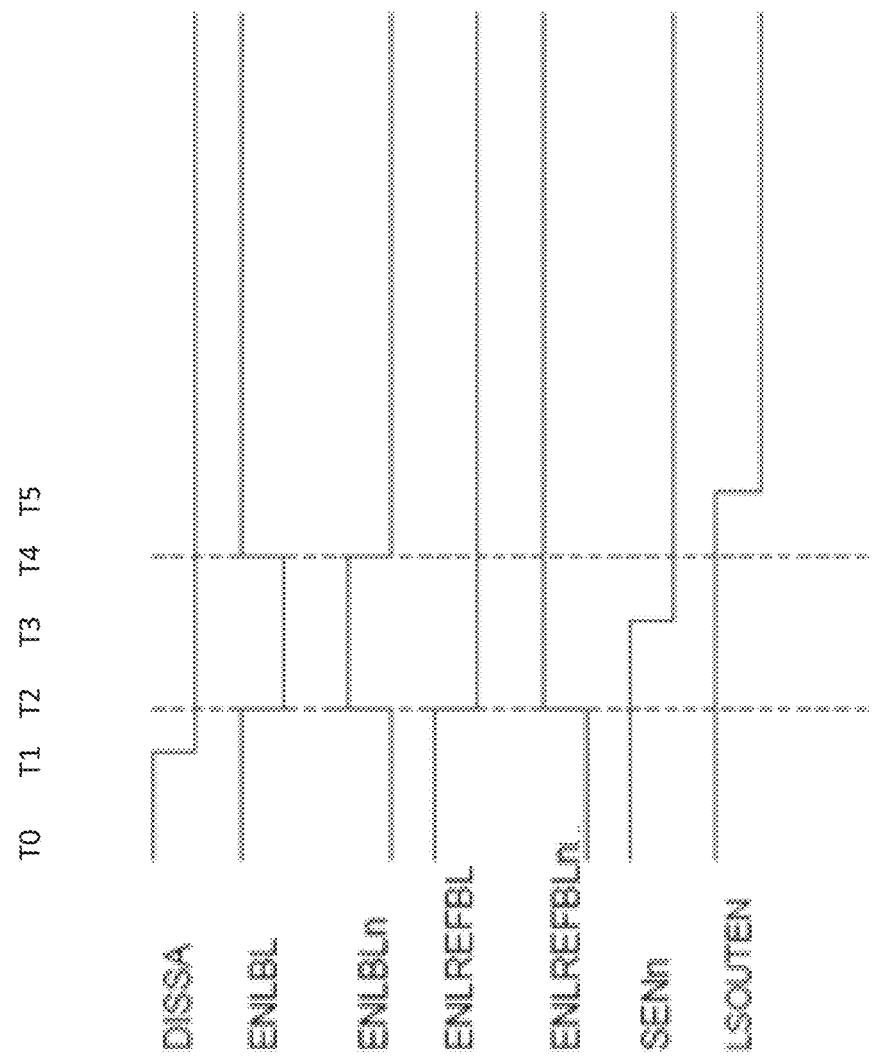
FIG. 4D illustrates control signals corresponding to FIGS. 4B and 4C, according to some embodiments of the present disclosure.

FIG. 4D illustrates control signals corresponding to FIGS. 4B and 4C, according to some embodiments of the present disclosure. FIG. 4D illustrates how signals, such as DISSA and SENn can be applied in coordination with one another. The pattern shown in FIG. 4D can correspond to a single read cycle. The same pattern can be repeated again for additional read cycles. For example, as shown in FIG. 4D, initially, at time T0, signal DISSA can be high, thereby disabling the rail-to-rail amplifier and maintaining nodes NA and NB at VSS.

Meanwhile, also at time T0, ENLBL and ENREFBL can be high, while complementary signals ENLBLn and ENREFBLnn can be low. Likewise, SENn can be high, thereby preventing Vcc from being presented to node NC.

LSOUTEN can be high, permitting the signal from the GBL to pass through the second pair of complementary transistors 440b to node NA.

At time T1, signal DISSA can be brought low. Then, at T2, ENLBL can be brought low, while ENLBLn can be brought high, effectively closing the gate at the local bit line. Similarly, at T2, ENLREFBL be brought low, while ENLREFBLn can be brought high, effectively closing the gate to the reference voltage source. At T3, SENn can be brought low, to permit Vcc to be presented to node NC.

After some settling, at T4, the gate at the local bit line can be effectively reopened by bringing ENLBLn low and ENLBL high. After that, at time T5, LSOUTEN can be brought low, effectively closing the gate between the global bit line and the local bit line after read operation is completed.

Figure 5:
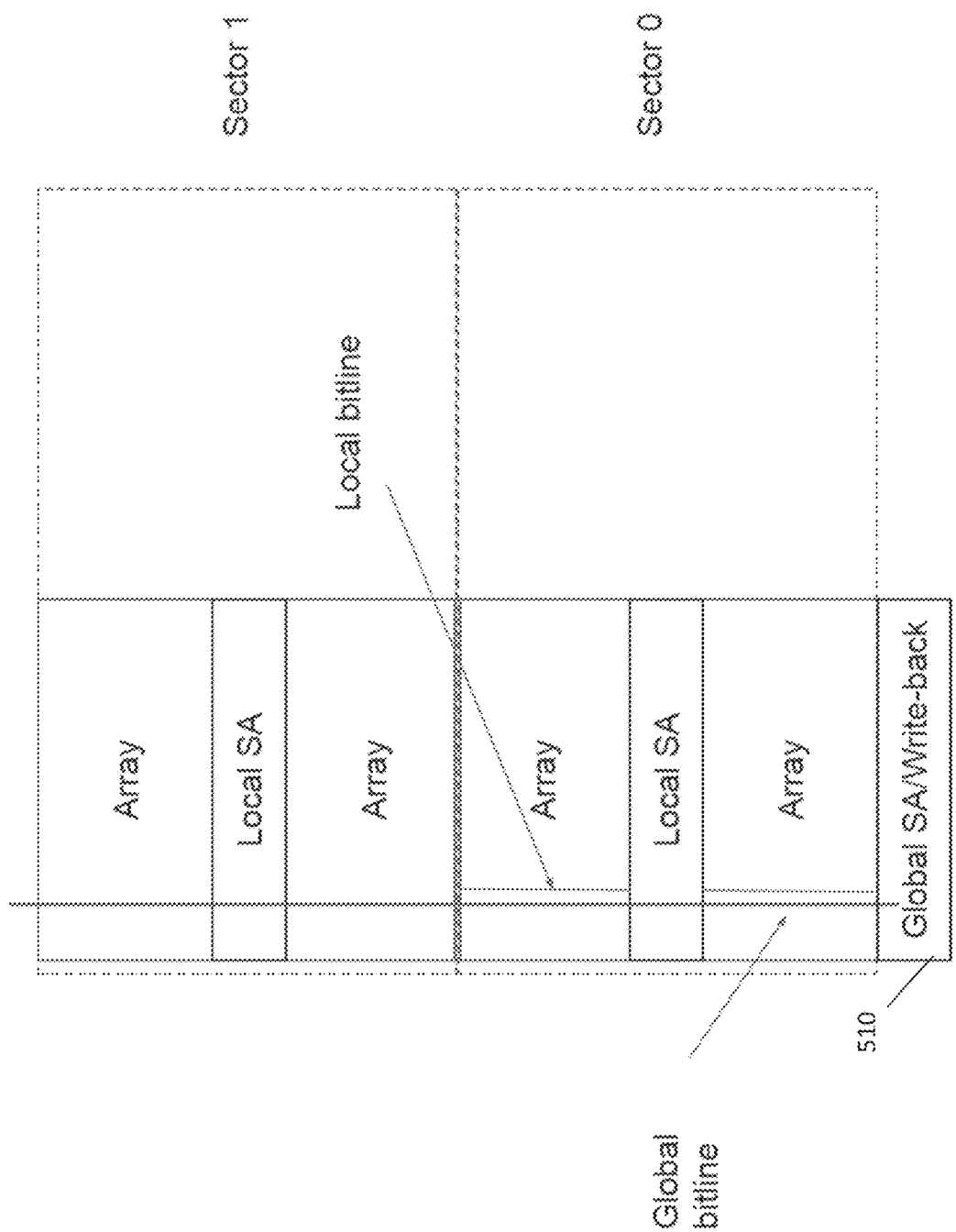
FIG. 5 illustrates an arrangement of a memory device according to some embodiments.

FIG. 5 illustrates an arrangement of a memory device according to some embodiments. FIG. 5 illustrates multiple sectors, labelled Sector 1 and Sector 0 for convenience. As shown in FIG. 5, each sector can include a plurality of memory arrays, with a local sense amplifier (SA) between them. Each array may have a local bit-line.

The local sense amplifier can operate as described above, to amplify signals to and/or from the global bit-line. Additionally, there can be a global sense amplifier 510 and write/back controller. There may be other elements and components of the memory, with these features being highlighted merely for convenience and not by way of limitation.

The architecture shown in FIG. 5 may be similar to that of a dynamic random access memory (DRAM). This architecture may be based on die size and performance considerations. Other architectures are also permitted. The general structure may be designed to permit pre-amplification and/or multiple-stage amplification (for example, one stage of amplification may be between the local and global bit-lines, and another stage of amplification may be after the global bit-line). Although the architecture may have some similarities to DRAM architecture, the physical characteristics of a FRAM 1T1C cell may involve very different operations and related structures. Likewise, while FRAM and DRAM may look like similar abbreviations, the characteristics of the different memory types may be very different from one another.

Figure 6:
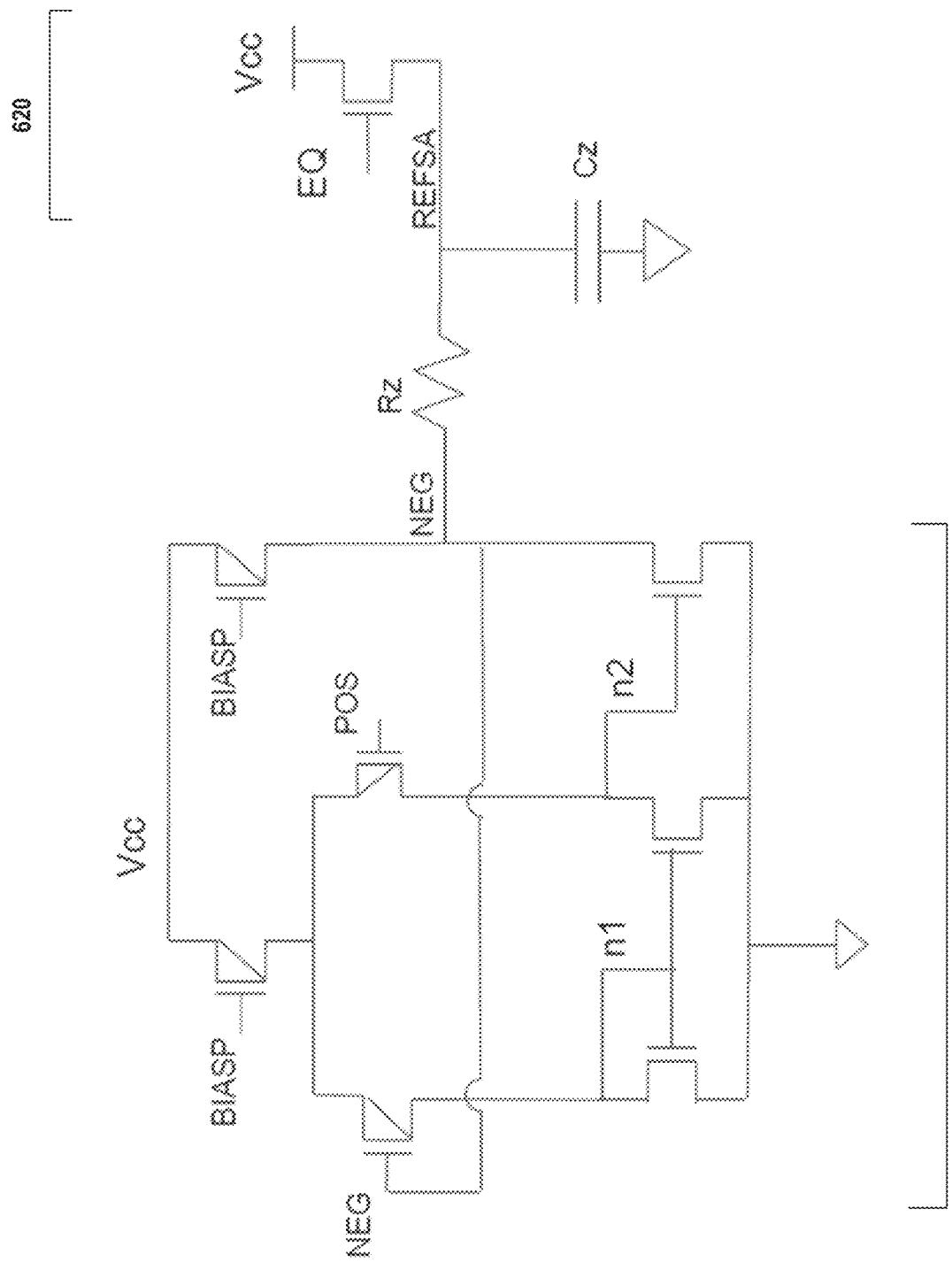
FIG. 6 illustrates a unity gain buffer with large signal zero insertion, according to some embodiments of the present disclosure.

FIG. 6 illustrates a unity gain buffer with large signal zero insertion, according to some embodiments of the present disclosure. As shown in FIG. 6, amplification circuitry 610 can be configured to provide a reference value, REFSA. A zero resistor, Rz, and a balancing capacitor, Cz can be provided. For this architecture, the dominant pole can be designed to be on the NEG node. The balancing capacitor, Cz, may have a size configured to match with the order of capacitance value of the number of normal cells on the bit-line, in contrast to the two reference cells. Thus, in case there are 256 cells, the capacitance of Cz may be about two hundred and fifty-six times the capacitance of the capacitors in the 1T1C cells of the bit-line, to provide the matched impedance between the local bit-line and the REFSA signal as the local SA closes the pass gates before amplification. This large capacitance may have a large settling time. Accordingly, biasing circuitry 620 may provide a bias voltage to capacitor Cz to improve the settling time.

Figure 7:
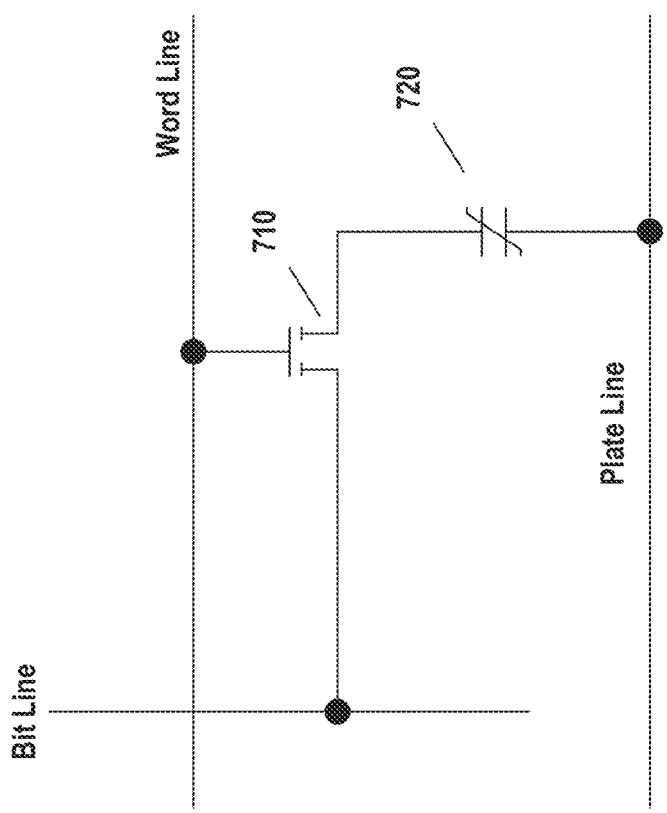
FIG. 7 illustrates a one-transistor, one-capacitor cell of a memory device according to certain embodiments.

FIG. 7 illustrates a one-transistor, one-capacitor cell of a memory device according to certain embodiments. As shown in FIG. 7, in a 1T1C cell, there may be one transistor 710 and one ferroelectric capacitor 720. The capacitor may be connected to a plate line as well to the transistor 710. The transistor 710 may be connected to a bit-line and word line as shown, such that the word line can select whether the bit-line charge is presented to the ferroelectric capacitor 720 using the transistor 710.

Figure 8A:
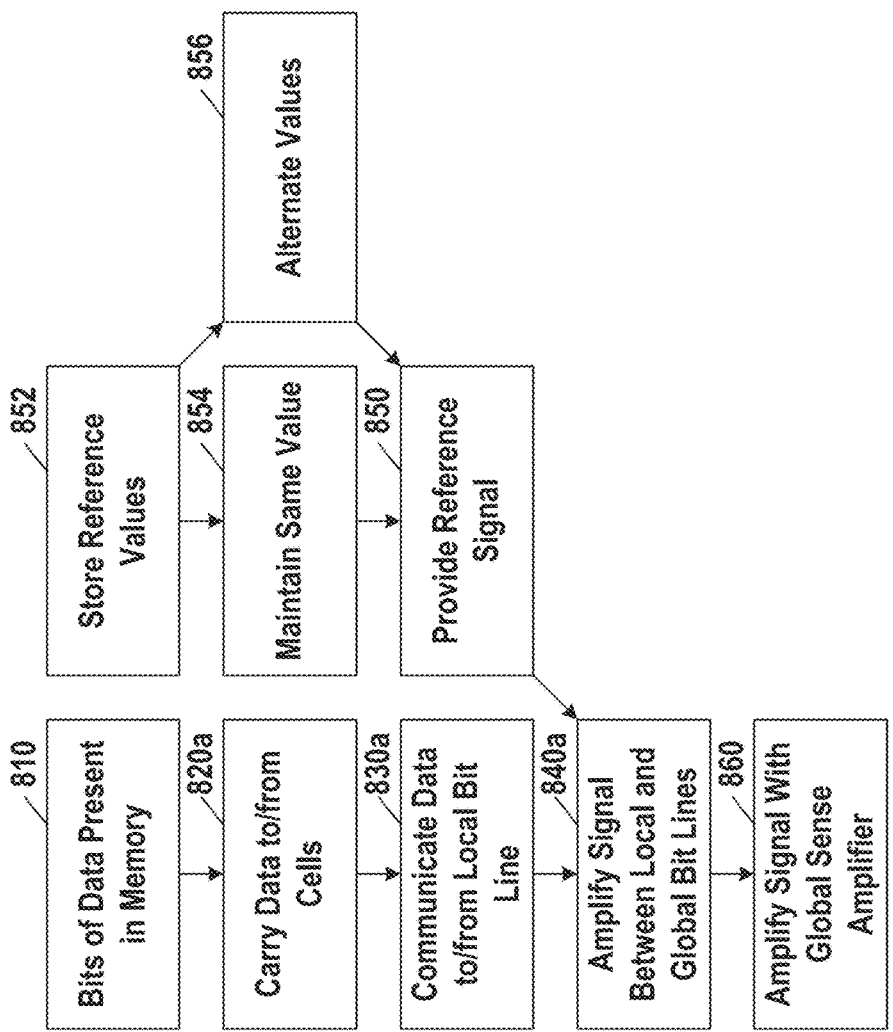
FIG. 8A illustrates a method of operating a memory device, according to some embodiments.

FIG. 8A illustrates a method of operating a memory device, according to some embodiments. The method can include, at 810, respective bits of data being present in a plurality of memory cells, for example due to previously having been stored there in a previous write cycle. Each memory cell can include one transistor and one capacitor electrically coupled to the at least one transistor as illustrated, for example, in FIG. 7. The capacitor can be a ferroelectric capacitor.

As shown in FIG. 8A, the method can include, at 820a, carrying data on a local bit-line, for example, to be read from the plurality of memory cells. The method can further include, at 830a, communicating using a global bit-line with the local bit-line to carry the data, for example, to be read from the plurality of memory cells.

The method can also include, at 840a, amplifying, using a local sense amplifier, a signal in the local bit-line and transferring the amplified signal to the global bit-line based on a reference signal. This is illustrated by the circuit example in FIG. 4A or 4B.

The method can further include, at 850, providing the reference signal using an amplifier or a buffer. The method can also include, at 852, storing, by a pair of reference cells, a logical one and a logical zero. These values can be considered reference values. The storing the logical one and the logical zero can include storing, by each reference cell of the pair of reference cells, always the same logical value, illustrated as maintaining the same value in each cell (e.g., one cell is always written to zero and the other cell is always written to one) at 854 in FIG. 8A. As another alternative, the storing the logical one and the logical zero can include, at 856, alternating logical values by each reference cell of the pair of reference cells.

The amplifying at 840a can involve amplifying the signal when the data is to be read from the memory cells and amplifying the signal when the data is to be written to the memory cells.

As mentioned above, the method can, at 850, include providing the reference signal using an amplifier or a buffer. The buffer can be a unity gain buffer, as illustrated for example by unity gain buffer 210 in FIGS. 2 and 4. The unity gain buffer 210 and/or the input to the unity gain buffer 210 can individually or in combination be considered a reference voltage source. The unity gain buffer can buffer the voltage provided by a pair of reference cells configured to store a logical one and a logical zero.

As illustrated, for example, in FIG. 2, the pair of reference cells can be configured to provide an average voltage of the pair of reference cells as the voltage.

As illustrated, for example, in FIG. 5, the plurality of cells can be arranged in a pair of arrays. Thus, the amplifying at 840a in FIG. 8A can include amplifying, by the local sense amplifier, signals of both arrays of the pair of arrays. Thus, there may be a two-to-one ratio of arrays to local sense amplifiers in a memory device. Moreover, each array of the pair of arrays can have its own individual local bit-line. Both arrays of the pair of arrays can be connected to the global bit-line. The method of FIG. 8A can also include, at 860, amplifying, by a global sense amplifier connected to the global bit-line and remote from the local sense amplifier, the signal carried on or to the global bit-line. The global sense amplifier 510, illustrated by way of example in FIG. 5, may be similarly constructed to the local sense amplifier. Alternatively, other forms of structure for the global sense amplifier are permitted.

Figure 8B:
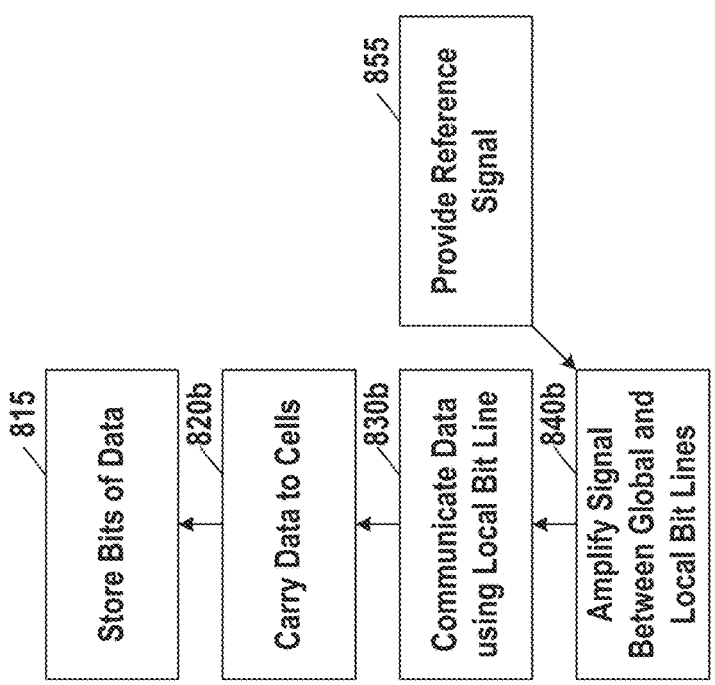
FIG. 8B illustrates a further method of operating a memory device, according to some embodiments.

FIG. 8B illustrates a further method of operating a memory device, according to some embodiments. While FIG. 8A may provide an example focused on a read process, FIG. 8B may provide an example focused on a write process. The method can include, at 815, storing respective bits of data in a plurality of memory cells. As in the case of FIG. 8A, in the case of FIG. 8B, each memory cell can include one transistor and one capacitor electrically coupled to the at least one transistor as illustrated, for example, in FIG. 7. The capacitor can be a ferroelectric capacitor.

As shown in FIG. 8B, the method can include, at 820b, carrying data on a local bit-line to be written to the plurality of memory cells. The method can further include, at 830b, communicating using a global bit-line with the local bit-line to carry the data to be written to the plurality of memory cells.

The method can also include, at 840b, amplifying, using a local sense amplifier, a signal and transferring the amplified signal from the global bit-line to the in the local bit-line based on a reference signal. The method can further include, at 855, providing the reference signal using an amplifier or a buffer. The reference signal can be generated by any desired circuit, as mentioned above. In other aspects, the method of FIG. 8A may be like the method of FIG. 8B including the applicability to memory devices including arrays of memory cells.

Figure 9:
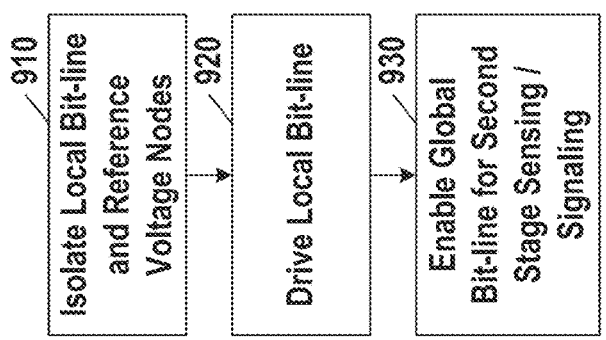
FIG. 9 illustrates an additional method according to certain embodiments of the present disclosure.

FIG. 9 illustrates a further method according to certain embodiments of the present disclosure. The method of FIG. 9 may be considered to be a part of or at least connected with the amplifying at 840a in FIG. 8A. As shown in FIG. 9, the method can include isolating a local bit-line node and a reference voltage node. This may be done using, for example, elements 440a and 440b in FIG. 4B or first gate 410a and second gate 410b in FIG. 4A. The third gate 420 may also be considered as providing further isolation of the local bit-line.

The method of FIG. 9 can also include, at 920, driving the local bit-line. The driving the local bit-line can be performed using the control signals shown in FIG. 4D and the circuits shown in FIG. 4B and FIG. 4C. Once the local bit-line has been driven to a high voltage or low voltage, for example to one of the two rail voltages in a rail-to-rail arrangement, at 930 the global bit-line can be enabled for second stage sensing/signaling, for example using a remote global bit-line sensor. The enabling can be performed by using signal LSOUTEN and first transistor 450 in FIG. 4B or third gate 420 in FIG. 4A.

According to one aspect of the present disclosure, a memory device can include a plurality of memory cells, each memory cell including at least one transistor and one capacitor electrically coupled to the at least one transistor. The capacitor can be configured to store a bit of data. The memory device can also include a local bit-line configured to carry data to be read from or written to the plurality of memory cells. The memory device can further include a global bit-line configured to communicate with the local bit-line to carry the data to be read from or written to the plurality of memory cells. The memory device can additionally include a local sense amplifier configured to amplify a signal in the local bit-line and transfer the amplified signal to the global bit-line based on a reference signal. The local sense amplifier can be configured to generate the amplified signal based on comparison to the reference signal.

In some embodiments, the memory device can also include a reference voltage source configured to generate the reference signal. The memory device can further include a first gate between a node of the local sense amplifier configured to receive the reference signal and the reference voltage source.

In some embodiments, the first gate can include a complementary pair of transistors.

In some embodiments, within a read cycle, the gate can be configured to isolate the reference signal at the node prior to the generation of the amplified signal.

In some embodiments, the memory device can further include a second gate between the global bit-line and the local bit-line. The second gate can be configured to, within a read cycle, isolate the local bit-line from the local sense amplifier prior to the generation of the amplified signal.

In some embodiments, the second gate can include a complementary pair of transistors.

In some embodiments, the local sense amplifier can be configured to amplify the signal when the data is to be read from the memory cells and to amplify the signal when the data is to be written to the memory cells.

In some embodiments, the local sense amplifier can be configured to drive the local bit-line to a high voltage when the signal is higher than the reference signal.

In some embodiments, the local sense amplifier can be configured to drive the local bit-line to a low voltage when the signal is lower than the reference signal.

In some embodiments, the plurality of memory cells can be arranged in a pair of arrays, and both arrays of the pair of arrays can be configured to be amplified by the local sense amplifier.

In some embodiments, each array of the pair of arrays can include a local bit-line, and both arrays of the pair of arrays can be connected to the global bit-line.

In some embodiments, the memory device can further include a global sense amplifier connected to the global bit-line, remote from the local sense amplifier, and configured to amplify the signal carried on or to the global bit-line.

According to another aspect of the present disclosure, a method of operating a memory device can include storing respective bits of data in a plurality of memory cells, each memory cell including at least one transistor and one capacitor electrically coupled to the at least one transistor. The method can also include carrying data on a local bit-line to be read from or to be written to the plurality of memory cells. The method can further include communicating using a global bit-line with the local bit-line to carry the data to be read from or written to the plurality of memory cells. The method can additionally include amplifying, using a local sense amplifier, a signal in the local bit-line and transferring the amplified signal to the global bit-line based on a reference signal, wherein the local sense amplifier generates the amplified signal based on comparison to the reference signal.

In some embodiments, the method can further include isolating, by the local sense amplifier, the local bit-line from the global bit-line during a read cycle prior to the amplifying.

In some embodiments, the method can further include providing the reference signal using a reference voltage generator. The method can additionally include isolating the local sense amplifier from the reference voltage generator during a read cycle prior to the amplifying.

In some embodiments, the method can further include driving the local bit-line with the amplified signal.

In some embodiments, the amplifying can include amplifying the signal when the data is to be read from the memory cells and amplifying the signal when the data is to be written to the memory cells.

In some embodiments, the plurality of memory cells can arranged in a pair of arrays and the amplifying can include amplifying, by the local sense amplifier, signals of both arrays of the pair of arrays.

In some embodiments, the method can further include amplifying, by a global sense amplifier connected to the global bit-line and remote from the local sense amplifier, the signal carried on or to the global bit-line.

According to yet another aspect of the present disclosure, a memory device can include a plurality of groups of arrays of memory cells connected by a global bit-line. Each group of arrays can include a plurality of arrays. Each array of the group of arrays having a local bit-line. The memory device can also include a local sense amplifier connected between a pair of arrays of the group of arrays and connected to each local bit-line of the group of arrays. The memory device can further include a plurality of memory cells in each array, each memory cell comprising at least one transistor and one capacitor electrically coupled to the at least one transistor. The capacitor can be configured to store a bit of data. The local sense amplifier can be configured to amplify a signal between the local bit-line of the respective array and the global bit-line based on a reference signal. The local sense amplifier can be configured to generate the amplified signal based on comparison to the reference signal.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
a plurality of memory cells, each memory cell comprising at least one transistor and one capacitor electrically coupled to the at least one transistor, wherein the capacitor is configured to store a bit of data;
a local bit-line configured to carry data to be read from or written to the plurality of memory cells;
a global bit-line configured to communicate with the local bit-line to carry the data to be read from or written to the plurality of memory cells; and
a local sense amplifier configured to amplify a signal in the local bit-line and transfer the amplified signal to the global bit-line based on a reference signal,
wherein the local sense amplifier is configured to generate the amplified signal based on comparison to the reference signal.

2. The memory device of claim 1, further comprising:
a reference voltage source configured to generate the reference signal; and
a first gate between a node of the local sense amplifier configured to receive the reference signal and the reference voltage source.

3. The memory device of claim 2, wherein the first gate comprises a complementary pair of transistors.

4. The memory device of claim 2, wherein, within a read cycle, the gate is configured to isolate the reference signal at the node prior to the generation of the amplified signal.

5. The memory device of claim 1, further comprising:
a second gate between the global bit-line and the local bit-line, wherein the second gate is configured to, within a read cycle, isolate the local bit-line from the local sense amplifier prior to the generation of the amplified signal.

6. The memory device of claim 5, wherein the second gate comprises a complementary pair of transistors.

7. The memory device of claim 1, wherein the local sense amplifier is configured to amplify the signal when the data is to be read from the memory cells and to amplify the signal when the data is to be written to the memory cells.

8. The memory device of claim 1, wherein the local sense amplifier is configured to drive the local bit-line to a high voltage when the signal is higher than the reference signal.

9. The memory device of claim 8, wherein the local sense amplifier is configured to drive the local bit-line to a low voltage when the signal is lower than the reference signal.

10. The memory device of claim 1, wherein the plurality of memory cells are arranged in a pair of arrays, and both arrays of the pair of arrays are configured to be amplified by the local sense amplifier.

11. The memory device of claim 10, wherein each array of the pair of arrays comprises a local bit-line, and wherein both arrays of the pair of arrays are connected to the global bit-line.

12. The memory device of claim 1, further comprising:
a global sense amplifier connected to the global bit-line, remote from the local sense amplifier, and configured to amplify the signal carried on or to the global bit-line.

13. A method of operating a memory device, the method comprising:
storing respective bits of data in a plurality of memory cells, each memory cell comprising at least one transistor and one capacitor electrically coupled to the at least one transistor;
carrying data on a local bit-line to be read from or to be written to the plurality of memory cells;
communicating using a global bit-line with the local bit-line to carry the data to be read from or written to the plurality of memory cells; and
amplifying, using a local sense amplifier, a signal in the local bit-line and transferring the amplified signal to the global bit-line based on a reference signal, % wherein the local sense amplifier generates the amplified signal based on comparison to the reference signal.

14. The method of claim 13, further comprising:
isolating, by the local sense amplifier, the local bit-line from the global bit-line during a read cycle prior to the amplifying.

15. The method of claim 13, further comprising:
providing the reference signal using a reference voltage generator; and
isolating the local sense amplifier from the reference voltage generator during a read cycle prior to the amplifying.

16. The method of claim 13, further comprising:
driving the local bit-line with the amplified signal.

17. The method of claim 13, wherein the amplifying comprises amplifying the signal when the data is to be read from the memory cells and amplifying the signal when the data is to be written to the memory cells.

18. The method of claim 13, wherein the plurality of memory cells are arranged in a pair of arrays and wherein the amplifying comprises amplifying, by the local sense amplifier, signals of both arrays of the pair of arrays.

19. The method of claim 13, further comprising:
amplifying, by a global sense amplifier connected to the global bit-line and remote from the local sense amplifier, the signal carried on or to the global bit-line.

20. A memory device, comprising:
a plurality of groups of arrays of memory cells connected by a global bit-line,
each group of arrays comprising a plurality of arrays;
each array of the group of arrays having a local bit-line;
a local sense amplifier connected between a pair of arrays of the group of arrays and connected to each local bit-line of the group of arrays; and
a plurality of memory cells in each array, each memory cell comprising at least one transistor and one capacitor electrically coupled to the at least one transistor, wherein the capacitor is configured to store a bit of data, wherein the local sense amplifier is configured to amplify a signal between the local bit-line of the respective array and the global bit-line based on a reference signal, wherein the local sense amplifier is configured to generate the amplified signal based on comparison to the reference signal.

* * * * *